United States Patent [19]
Mack et al.

[11] Patent Number: 4,739,407
[45] Date of Patent: Apr. 19, 1988

[54] FREQUENCY MODULATION TELEVISION RECEIVER WITH TRACKING FILTER

[75] Inventors: Walter Mack, Fairfax County, Va.; Thomas Olszewski, Walkersville, Md.

[73] Assignee: Hekimian Laboratories, Inc., Gaithersburg, Md.

[21] Appl. No.: 844,685

[22] Filed: Mar. 27, 1986

[51] Int. Cl.[4] .......................... H04N 5/14; H04N 5/44
[52] U.S. Cl. ........................................ 358/188; 358/23
[58] Field of Search ..................... 358/188, 23, 25, 31, 358/195.1, 160, 174, 175, 21 R; 455/207, 315, 340, 210, 205

[56] References Cited

U.S. PATENT DOCUMENTS

| | | | |
|---|---|---|---|
| 2,976,408 | 3/1961 | Colaguori | 455/205 |
| 3,792,357 | 2/1974 | Hekimian | 455/210 |
| 4,035,730 | 7/1977 | Clayton | 455/210 |
| 4,283,739 | 8/1981 | Martinez | 358/23 |
| 4,633,315 | 12/1986 | Kasperkovitz | 358/188 |

OTHER PUBLICATIONS

"An Advanced Threshold-Extension Tracking Filter for Satellite Video Reception", by W. M. Rogers, Proceeding of the 1981 *IEEE National Telecommunications Conference*, Nov. 29–Dec. 3, 1981, pp. E6.5.1–E6.5.7.
"Design and Performance of Phase-Locked Circuits Capable of Near Optium Performance Over a Wide Range of Input Signals and Noise Levels" by R. M. Jaffee and E. Rechtin, *IRE Transactions on Information Theory*, vol. IT-1, pp. 66–76, Mar. 1955.
"Synchronized Oscillators as F-M Receiver Limiters" by C. W. Carnenan and H. P. Kalmus, *Electronics*, Aug. 1944.

Primary Examiner—Tommy P. Chin
Attorney, Agent, or Firm—Brumbaugh, Graves, Donohue & Raymond

[57] ABSTRACT

A wide-band FM receiver for satellite-transmitted NTSC color television signals includes a novel tracking filter circuit for extending the noise threshold of the receiver. The tracking filter circuit includes a voltage steerable bandpass filter and a feedback control loop that provides a different loop gain for portions of the feedback signal having frequencies corresponding to the spectral components of the chrominance signal and for portions of the feedback signal having frequencies corresponding to the spectral components of the luminance signal. The control loop comprises a loop amplifier, a comb filter and a low-pass filter for separating the feedback signal according to frequency, and two attenuators to allow the setting of different loop gains for the two frequency-separated portions of the feedback signal. The loop gain at frequencies corresponding to the spectral components of the luminance signal is set at a relatively low level to avoid nonlinearities that cause differential gain and differential phase, while the loop gain at frequencies corresponding to the spectral components of the chrominance signal is set at a relatively high level to achieve optimal tracking accuracy and noise threshold extension without introducing significant subjective color distortion.

5 Claims, 2 Drawing Sheets

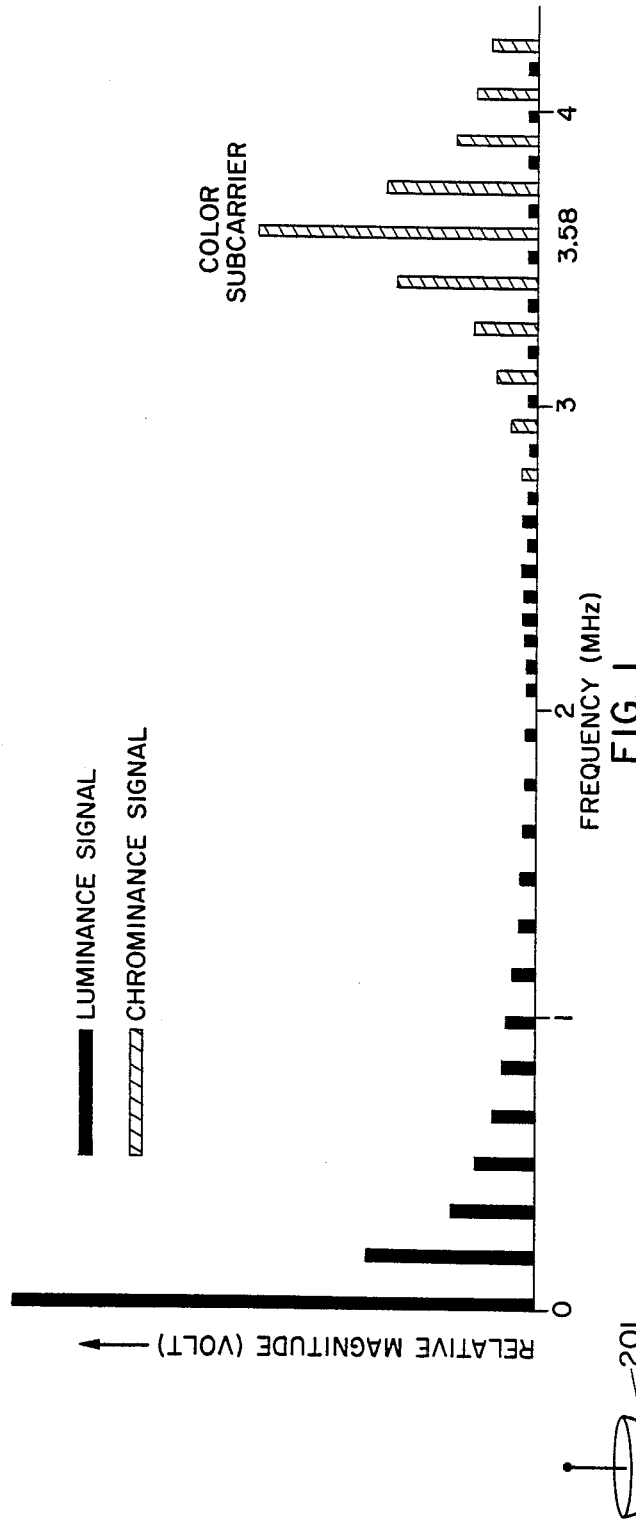
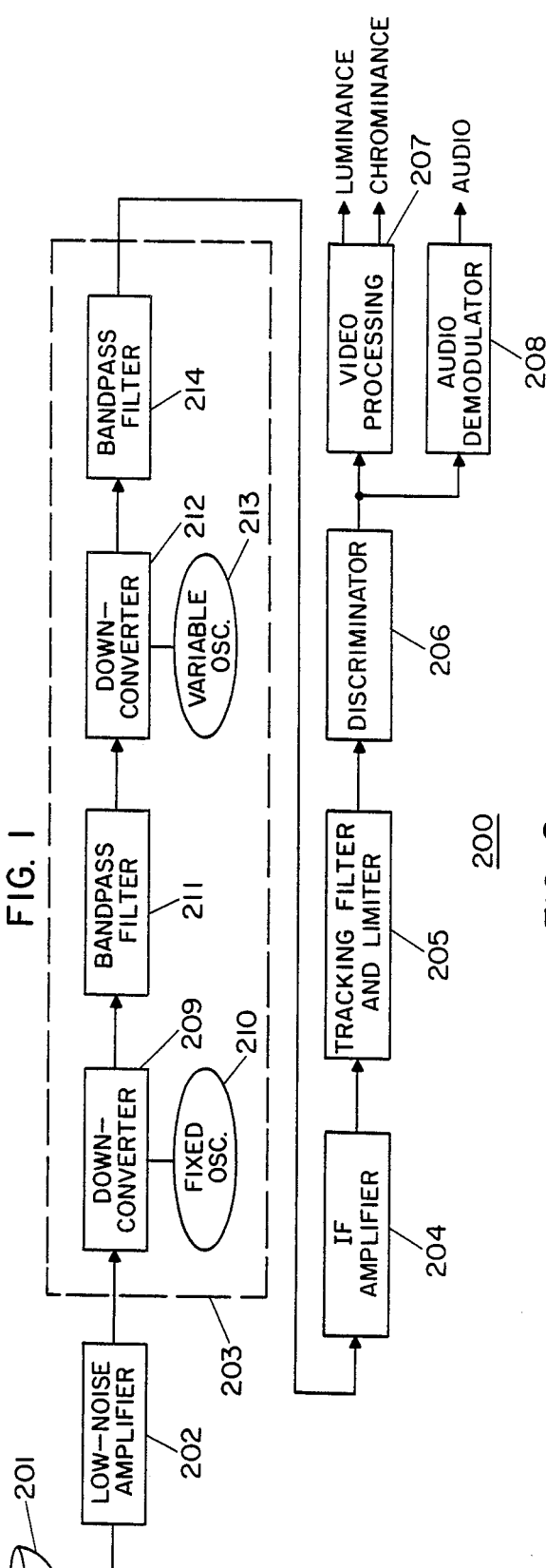
FIG. 1
FIG. 2

FREQUENCY MODULATION TELEVISION RECEIVER WITH TRACKING FILTER

BACKGROUND OF THE INVENTION

The present invention relates to wide-band frequency modulation (FM) television receivers and, more particularly, to a FM color television receiver which includes a novel tracking filter circuit for improved noise threshold performance and minimal subjective color distortion.

Wide-band FM receivers are known in the art. Such receivers are used in frequency division multiplexed (FDM) multichannel telephony and in FM television systems. Recent wide-spread broadcasting of frequency-modulated television signals by communications satellites has created a demand for high performance FM television receivers for use in low-cost earth stations for private homes. Because such home earth stations are generally equipped with relatively small dish antennae, the receivers used in such earth stations must be capable of providing acceptable quality picture and sound despite the relatively weak signals that are obtained from the small antennae.

In general, the signal-to-noise ratio (SNR) of an FM receiver is directly proportional to the carrier-to-noise ratio (CNR), provided that the CNR is above a certain threshold value. Below that threshold, the SNR of the receiver falls off very rapidly with decreasing CNR, and in the case of a television receiver, the subjective quality of the picture and sound quickly degrades with diminishing SNR until it becomes no longer acceptable to the viewer. In a conventional FM receiver, the noise threshold typically occurs when the CNR is approximately 10 dB.

Several approaches are known for extending the noise threshold of an FM receiver to lower values of CNR. In general, each of these approaches achieves threshold extension by reducing the effective predetection bandwidth to less than the normal IF bandwidth of the receiver. In one such approach, which is commonly referred to as FM feedback (FMFB), the IF signal is passed through a fixed narrowband filter, and a discriminator in conjunction with a voltage-controlled local oscillator are used to keep the IF signal centered within the passband of the filter by automatic frequency control action. A description of the FMFB technique may be found in U.S. Pat. No. 2,075,503.

Another approach for extending the noise threshold of an FM receiver uses a phase-lock loop or phase-lock oscillator whereby the noise reduction filtering is obtained at baseband. Descriptions of this technique and a variation thereof can be found in articles entitled "Design and Performance of Phase-Locked Circuits Capable of Near Optimum Performance Over a Wide Range of Input Signal and Noise Levels", by R. M. Jaffee and E. Rechtin, *IRE Transactions on Information Theory*, Vol. IT-1, pp. 66–76, March, 1955, and "Synchronized Oscillators as F-M Receiver Limiters", by C. W. Carnahan and H. P. Kalmus, *Electronics*, August, 1944.

A third approach for extending the noise threshold in a FM receiver, which is described in U.S. Pat. No. 2,976,408, uses a closed-loop tracking filter inserted ahead of the demodulator of an otherwise conventional FM receiver. The tracking filter typically includes a voltage-tunable, bandpass filter (steerable filter) having a passband that is narrower than the normal IF bandwidth and a feedback control loop for keeping the passband of the steerable filter approximately centered on the instantaneous frequency of the IF signal. The control loop typically senses the phase shift of the steerable filter and uses the sensed phase shift to correct the tuning of the filter to track the IF signal. The output provided by the tracking filter is demodulated by a conventional FM demodulator.

For TV earth station applications the tracking filter approach to threshold extension is highly advantageous in that it inherently has a simpler control loop than either the FMFB or phase-locked loop approaches and thus minimizes control-loop delay time, which is an important parameter when high baseband frequencies are encountered such as those contained in a color TV signal. Another advantage results from the inherent configuration of the tracking filter approach whereby it can be added to a conventional FM receiver thereby upgrading it to an FM threshold extension receiver. Moreover, the tracking filter can be easily bypassed where the incoming signal is strong enough such that threshold extension is not required.

However, threshold extension techniques, including the tracking filter approach, have drawbacks when used in receivers for color television signals owing to a tendency of the threshold extension circuits to exhibit transmission nonlinearities when the control loop parameters are selected for optimal noise threshold performance. For the tracking filter approach, the control loop parameters include loop gain and the bandwidth of the steerable filter. Such nonlinearities can produce significant degradation of the subjective quality of the colors of a television picture. In this regard, it is noted that a typical television viewer is less tolerant of noise or distortion in the colors of a television picture than he or she is of noise or distortion in the picture itself. Consequently, design compromises must be made to the bandwidth and loop gain in order to reduce the subjective color distortion to an acceptable level. Since the effectiveness of the tracking filter circuit for threshold extension depends on the optimum bandwidth of the steerable filter and the accuracy with which it tracks the IF signal, such design compromises severely limit the noise threshold performance of the tracking filter circuit.

One known attempt at improving the performance of a tracking filter circuit in a FM color television receiver is to use a double-pole steerable filter, which provides a "flatter" passband and permits the elimination of a phase shifter in the tracking filter circuit. The use of such a steerable filter is described in an article entitled "An Advanced Threshold Extension Tracking Filter for Satellite Video Reception", by W. M. Rogers, *Proceeding of the 1981 I.E.E.E. National Telecommunications Conference*, Nov. 29–Dec. 3, 1981, pp. E6.5.1–E6.5.7. Although the use of a double-pole steerable filter in the tracking filter circuit of a FM television receiver does improve the noise threshold performance of the receiver to a degree, it is not entirely satisfactory in that such improvement in noise threshold performance is achieved at the expense of subjective color distortion in the television picture.

U.S. Pat. No. 3,792,357, having a common assignee and a common inventor with the present application, describes a technique for improving the performance of an FDM/FM multichannel telephony receiver having a threshold-extension tracking filter circuit by adding a loop filter in the feedback control loop of the tracking filter circuit. The loop filter used has characteristics that substantially match those of the pre-emphasis filter in the modulator of the transmitter. While the addition of a pre-emphasis loop filter to the tracking filter circuit substantially improves the performance of the FDM/FM receiver, the technique does not produce expected results when applied to an FM television receiver, because it cannot provide significant improvement in noise threshold performance without introducing subjective color distortion in the television picture.

Accordingly, a need exists for a FM television receiver having a tracking filter circuit that provides improved noise threshold performance without introducing unacceptable subjective color distortion.

SUMMARY OF THE INVENTION

The foregoing and other disadvantages of the prior art are overcome, in accordance with the present invention, by including in a FM television receiver a tracking filter circuit with a feedback control loop which provides a relatively high loop gain at frequencies corresponding to the spectral components of the chrominance signal and a relatively low loop gain at frequencies corresponding to the spectral components of the luminance signal so as to substantially avoid the nonlinear effects of differential gain and differential phase, which cause subjective color distortion.

According to the preferred embodiment of the present invention, the tracking filter circuit comprises an input amplifier receiving an IF signal modulated with chrominance and luminance signals and providing the IF signal to two circuit branches. One circuit branch includes a 90° phase shifter receiving the IF signal and providing a phase-shifted IF signal, and a first limiter receiving the phase-shifted IF signal and providing an amplitude-limited phase reference signal. The other branch comprises a single-pole, varactor-tuned tank circuit receiving the IF signal and providing a filtered IF signal, and a second limiter receiving the filtered IF signal and providing an amplitude-limited phase comparison signal. The tank circuit is responsive to a control voltage for tuning the center frequency of its passband. In addition, the tracking filter circuit includes a phase comparator comprising a double balanced mixer receiving the phase reference and phase comparison signals and providing an error signal indicative of the phase difference between the phase reference signal and the phase comparison signal. The control loop of the tracking filter circuit includes an amplifier having an input coupled to a first and a second signal path, and an output coupled to provide the control voltage to the tank circuit. The first signal path includes a first attenuator receiving the error signal from the mixer and providing a attenuated error signal, and a comb filter receiving the attenuated error signal and providing only portions of that signal having frequencies corresponding to the spectral components of the chrominance signal to the input of the amplifier. The second signal path includes a low-pass filter receiving the error signal from the mixer and providing only portions of the error signal with frequencies corresponding to the spectral components of the luminance signal, and a second attenuator receiving the portion of the error signal provided by the low-pass filter and attenuating those portions of the error signal before providing them to the input of the amplifier. The first and second attenuators are both resistive voltage dividers, with the first attenuator providing a smaller attenuation than the second.

BRIEF DESCRIPTION OF THE DRAWING

The present invention may be better understood with reference to the following detailed description of the preferred embodiment, taken in conjunction with the accompanying drawing, in which:

FIG. 1 is a graphical representation of the spectral components of the luminance and chrominance signals of an NTSC color television signal;

FIG. 2 is a schematic block diagram of an FM television receiver in accordance with the preferred embodiment of the present invention.

Throughout the figures of the drawing, the same reference characters and numerals are used to denote like features, components and portions of the illustrated apparatus.

DETAILED DESCRIPTION

Figure 3:
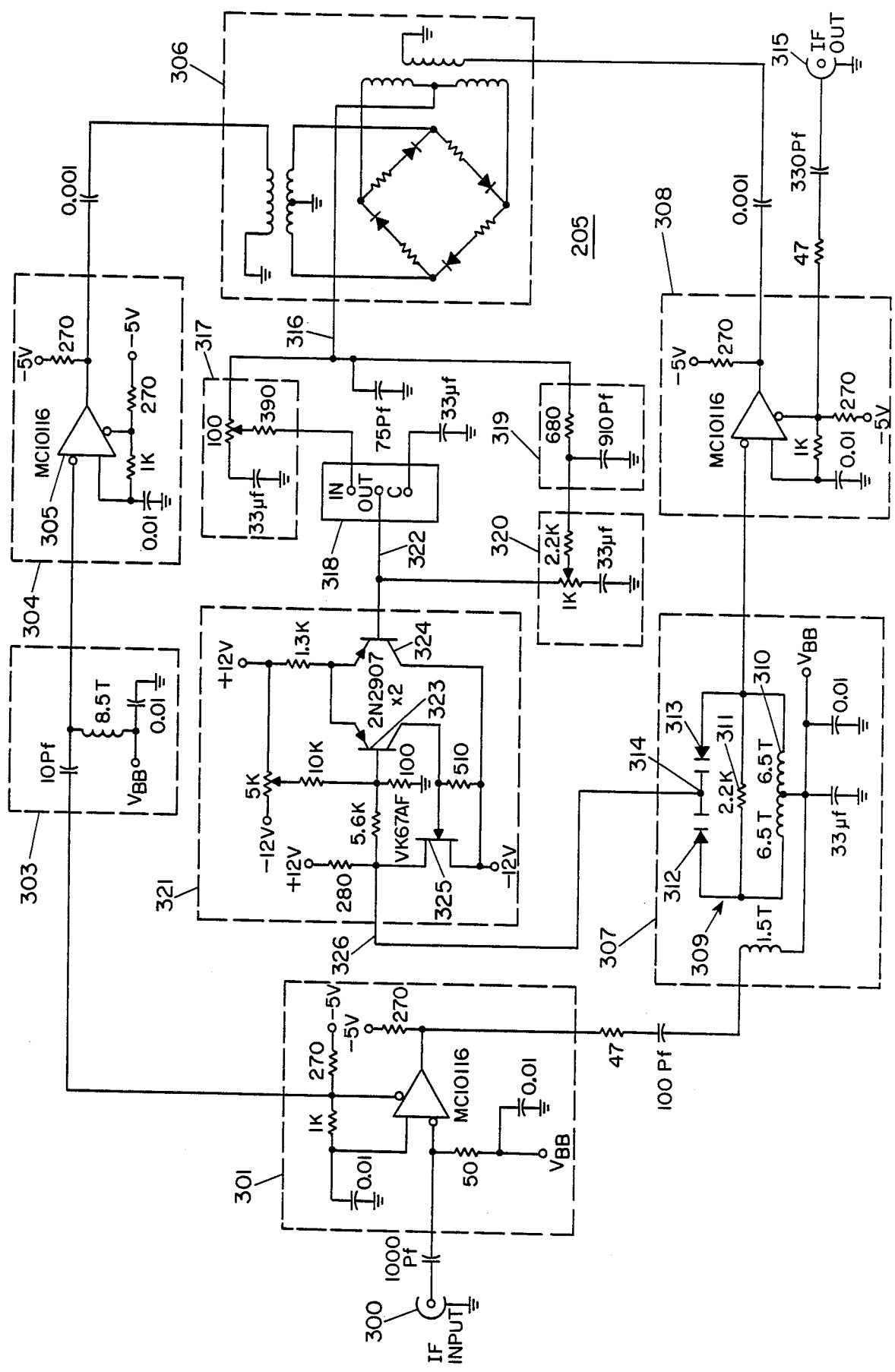
FIG. 3 is a schematic circuit diagram of the tracking filter circuit of the receiver of FIG. 2.

Referring now to FIG. 1, there is shown a graphical representation of the spectrum of a typical color television signal in accordance with the National Television System Committee (NTSC) standard used for television transmission in the United States and Canada. For simplicity of illustration, the spectral components of the audio modulation of the television signal are omitted from the depiction in FIG. 1. Under the NTSC standard, the television picture is defined in terms of three characteristics, namely, luminance, hue and saturation. Luminance is the intensity or brightness of each point of a television picture and is the only characteristic needed for black and white television. Hue is the color of each point of a television picture in terms of the primary colors, i.e., red, blue, green, yellow, etc. Saturation is the degree to which the hue is mixed with white. A color television signal must therefore contain information as to luminance, hue and saturation.

The spectral components of the signal carrying the luminance information are represented by the vertical black lines in FIG. 1. This luminance signal consists of a number of fixed frequencies separated by the line scanning frequency. The fixed frequencies vary in phase and amplitude at a relatively slow rate as a result of changes or motion in the picture. Therefore, each of the fixed frequencies can be considered a carrier and the effect of changes or motion in the picture as sidebands (not shown) added to each side of the carrier.

The hue and saturation information is added to the luminance signal in the form of a new broadband signal, called the chrominance signal, modulated on a 3.58 MHz color subcarrier. The amplitude of the chrominance signal represents the saturation of the color, while the instantaneous phase relationship of the color subcarrier to a reference synchronizing signal of the same frequency determines the hue.

The spectral components of the chrominance signal are represented by the cross-hatched vertical lines in FIG. 1. The smaller components of the chrominance signal on either side of the subcarrier are produced by line scanning and are, therefore, separated from each other by the line frequency. The chrominance components vary in amplitude and phase in accordance with the hue and saturation information being transmitted.

Because the frequency of the color subcarrier (3.579545 MHz) is an odd multiple of the half-line frequency (7867 Hz for color television), the spectral components of the chrominance signal are interleaved with the high frequency spectral components of the luminance signal.

Distortion of the color saturation can occur if the gain of the transmission system at the chrominance signal frequency is a function of the amplitude of the luminance signal. This variation in the amplitude transmission of the color signal caused by variation in the amplitude of the luminance signal is called "differential gain". The presence of differential gain anywhere in a color television transmission system may result in a picture in which some colors appear dim or washed out while others appear overly intense.

Distortions in hue can occur if the instantaneous phase shift of the transmission system at the chrominance signal frequency is a function of the amplitude of the luminance signal. The variation in color carrier phase shift caused by variation in the amplitude of the luminance signal is called "differential phase" and results in a picture in which the colors are incorrect. Both the differential gain and the differential phase are caused by nonlinearities in the transmission system.

Turning now to FIG. 2, there is shown a schematic block diagram of an FM color television receiver 200 according to the present invention. The receiver 200 is of a conventional configuration except for the addition of a special tracking filter circuit 205 interposed between the IF amplifier 204 and the discriminator 206. As mentioned above, the receiver 200 may include means for bypassing the tracking filter 205 (not shown) when the incoming signal is sufficiently strong that threshold extention is not required.

The receiver 200 includes a low-noise, front end amplifier 202 receiving a frequency-modulated color television signal from an antenna 201. In the present example, the television signal is C-band signal downlinked from a communications satellite to the dish antenna 201 of an earth station at a frequency of 4 GHz. The output of the amplifier 202 is provided to a down-converting circuit 203 which converts the incoming television signal to a corresponding intermediate frequency (IF) signal centered about 70 MHz. In the present example, the down-converting circuit 203 comprises a first down-converter 209, which mixes the incoming television signal with the output of a fixed frequency local oscillator 210. The output of the first down-converter 209 is passed through a first bandpass filter 211 before it is provided to a second down-converter 212, which mixes the signal received at its input with the output of a variable frequency local oscillator 213. The output of the second down-converter is received by a second bandpass filter 214, which provides the IF signal.

The IF signal is first amplified by an IF amplifier 204 with a bandwidth of approximately 36 MHz before it is passed through a novel tracking filter and limiter 205. The output of the tracking filter and limiter 205 is received by a FM discriminator 206, which in turn provides its output to a video processing circuit 207 and an audio demodulator 208. The video processing circuit 207 extracts the luminance and chrominance signals and provides such signals to the driving circuitry of a color television display while the audio demodulator 208 extracts the audio signal for such display. The construction of the low-noise amplifier 202, the down-converting circuit 203, the IF amplifier 204, the discriminator 206, the video processing circuit 207 and the audio demodulator 208 may be conventional and forms no part of the present invention. Therefore, the details of those circuits will not be further described.

Referring now to FIG. 3, there is shown a schematic circuit diagram of the tracking filter circuit 205 of the receiver 200 of FIG. 2. The tracking filter circuit 205 includes an input amplifier 301 comprising an ECL line receiver 302, such as a model MC10116. The input amplifier 301 receives the incoming IF signal through an input connector 300 and provides complementary versions of that signal to two branch circuits. One branch circuit, which receives the non-inverted IF signal, includes a 90° phase shift network 303 and a limiter 304. The limiter 304, which also comprises an ECL line receiver 305, provides an amplitude-limited phase reference signal to a balanced mixer 306 serving as a phase comparator.

The second branch circuit, which receives the inverted IF signal, includes a steerable bandpass filter 307 and another limiter 308. The steerable filter comprises a single-pole tank circuit 309 consisting of the parallel combination of an inductor 310, a resistor 311 and two varactor diodes 312 and 313, serving as voltage dependent capacitors. The capacitances of the varactor diodes 312 and 313 and, therefore, the center frequency of the steerable filter 307 may be altered by a control voltage applied to a control terminal 314. The limiter 308 is similar to limiter 304 and provides an inverted, amplitude-limited output of the steerable filter 307 to the balanced mixer 306 for phase comparison with the phase reference signal. In addition, the limiter also provides a non-inverted, amplitude-limited output of the steerable filter 307 at an output connector 315.

The balanced mixer 306, which may be a Mini-Circuit Laboratories, Inc. Model SRA-1, compares the phases of the signals from the limiters 304 and 308 and provides an error voltage proportional to the phase difference between those signals at a terminal 316.

The tracking filter circuit 205 also includes a feedback control loop which comprises a first attenuator 317, a comb filter 318, a low-pass filter 319, a second attenuator 320 and a loop amplifier 321. The first attenuator 317 is an adjustable, resistive voltage divider, connected between terminal 316 of the balanced mixer 306 and the comb filter 318 for providing an attenuated error voltage to the comb filter. The comb filter 318, which may be a Mitsumi Electric Co. Model GDL-47C60-2, is connected between the first attenuator 317 and the input terminal 322 of the loop amplifier 321 for passing only those frequency components of the attenuated error voltage that correspond to the spectral components of the chrominance signal to the loop amplifier.

The low-pass filter 319 is an R-C filter having a cutoff frequency of approximately 300 KHz. It is connected between terminal 316 of the balanced mixer 306 and the second attenuator 320 for passing those frequency components of the error voltage that are below 300 KHz to the second attenuator 320, including frequency components that correspond to the spectral components of the luminance portion of the television signal. The second attentuator 320 is an adjustable, resistive voltage divider connected between the low-pass filter 319 and the loop amplifier 321 for providing an attenuated output of the low-pass filter to input 322 of the loop amplifier.

The loop amplifier 321 is a discrete amplifier comprising an emitter coupled pair of PNP transistors 323 and 324 and a JFET output stage 325. The input 322 of the loop amplifier 321 receives the signals from the comb filter 318 and the second attenuator 320, while the output of the loop amplifier 326 provides the control voltage for the steerable filter 307.

Because the combination of a comb filter 318 and a low-pass filter 319 are used to separate the frequency components of the error signal that correspond to the spectral components of the chrominance signal from those that correspond to the spectral components of the luminance signal and different attenuators 317 and 320 are used in the respective signal paths for the separated signals, the loop gain of the control loop for frequencies corresponding to the spectral components of the chrominance signal can be adjusted independently of the loop gain for frequencies corresponding to the spectral components of the luminance signal. As such, the loop gain at frequencies corresponding to the spectral components of the luminance signal is advantageously adjusted to a relatively low value at which nonlinearities that can cause significant differential gain and differential phase of the chrominance signal are avoided. On the other hand, the loop gain at frequencies corresponding to the spectral components of the chrominance signal is advantageously adjusted to a relatively high value to assure good tracking accuracy and noise threshold performance without introducing significant subjective color distortion. Using the tracking filter circuit of FIG. 3, a noise threshold improvement of approximately 3 dB is achieved without noticeable degradation in the color of the television picture.

It will be understood that various modifications and alterations may be made to the disclosed exemplary embodiment by one skilled in the art without departing from the spirit and scope of the invention as defined in the appended claims. For example, a multiple pole voltage-tunable bandpass filter may be substituted for the single-pole tank circuit in the steerable filter 307, a comb filter passing frequencies corresponding to the spectral components of the luminance signal may be substituted for the low-pass filter 319 and different circuit configurations may be used for the input amplifier 301, the phase shift network 303, the limiters 304 and 308, the voltage dividers 317 and 320 and the phase comparator 306.

We claim:

1. A frequency modulation television receiver comprising:
   means for receiving a frequency-modulated color television signal;
   means for converting the television signal to a corresponding IF signal, the IF signal being modulated with a luminance signal and a chrominance signal;
   means for amplifying the IF signal;
   a tracking filter circuit receiving the IF signal from the IF amplifying means and providing a filtered IF signal; and
   demodulator means coupled to receive the filtered IF signal and providing the luminance and chrominance signals, wherein the tracking filter circuit comprises:
   a steerable bandpass filter coupled to receive the IF signal and provide said filtered IF signal, the steerable filter being responsive to a control signal for tuning its passband;
   phase comparator means for comparing the phase of the IF signal with that of the filtered IF signal and providing an error signal indicative of the phase difference therebetween; and
   a control loop responsive to the error signal provided by the phase comparator means for providing the control signal to the steerable filter to keep its passband substantially centered about the IF signal, the control loop including loop amplifying means for amplifying the control signal and providing a higher loop gain for frequencies corresponding to spectral components of the chrominance signal than for frequencies corresponding to the spectral components of the luminance signal.

2. A television receiver according to claim 1 wherein the control loop comprises: said loop amplifier having an input for receiving the error signal from the phase comparator means coupled to a first and a second signal path and an output coupled to provide the control signal to the steerable filter, the first signal path comprising first attenuator means for providing a first attenuation of signals passing therethrough and first loop filter means for passing only frequencies corresponding to spectral components of the chrominance signal, the second signal path comprising second loop filter means for substantially removing the spectral components of the chrominance signal and second attenuator means for providing a second attenuation of signals passing therethrough, wherein the first attenuation is smaller then the second attenuation.

3. A television receiver according to claim 2 wherein the first and second attenuator means each comprises a resistive voltage divider, the first loop filter means comprises a comb filter for passing only frequencies corresponding to the spectral components of the chrominance signal and the second loop filter means comprises a low-pass filter for passing frequencies below 300 KHz.

4. A television receiver according to claim 2 wherein the phase comparator means comprises: a phase shift network receiving the IF signal and providing a phase-shifted IF signal; and first limiter receiving the phase-shifted IF signal and providing an amplitude limited phase reference signal; a second limiter receiving the filtered IF signal from the steerable filter and providing an amplitude-limited phase comparison signal; and a double-balanced mixer receiving the amplitude-limited phase reference signal and the amplitude-limited phase comparison signal and providing the error signal.

5. A television receiver according to claim 4 further comprising an input amplifier having an input coupled to receive the IF signal from the IF amplifying means, a non-inverting output providing the IF signal to the phase shift network and an inverting output providing the IF signal to the steerable filter, wherein the first limiter has an inverting output providing the amplitude-limited phase reference signal to the mixer, and the second limiter has an inverting output providing the amplitude-limited phase comparison signal to the mixer and a non-inverting output providing the filtered IF signal.

* * * * *

UNITED STATES PATENT AND TRADEMARK OFFICE
CERTIFICATE OF CORRECTION

PATENT NO. : 4,739,407
DATED : April 19, 1988
INVENTOR(S) : Mack et al.

It is certified that error appears in the above-identified patent and that said Letters Patent is hereby corrected as shown below:

Column 3, line 45: The word "reoeiving" should read --receiving--; line 54: The words "a attenuated" should read --an attenuated--.

Column 5, line 31: The word "extention" should read --extension--.

Column 8, line 29: The word "then" should read --than--; line 41: The words "and first" should read --a first--.

Signed and Sealed this

Twentieth Day of September, 1988

Attest:

DONALD J. QUIGG

*Attesting Officer*    *Commissioner of Patents and Trademarks*